United States Patent
Oja et al.

(10) Patent No.: US 10,911,050 B2
(45) Date of Patent: Feb. 2, 2021

(54) FREQUENCY REFERENCE OSCILLATOR DEVICE AND METHOD OF STABILIZING A FREQUENCY REFERENCE SIGNAL

(71) Applicant: KYOCERA Tikitin Oy, Espoo (FI)

(72) Inventors: Aarne Oja, Espoo (FI); Antti Jaakkola, Espoo (FI)

(73) Assignee: KYOCERA Tikitin Oy, Espoo (FI)

( * ) Notice: Subject to any disclaimer, the term of this patent is extended or adjusted under 35 U.S.C. 154(b) by 0 days.

(21) Appl. No.: 16/640,811

(22) PCT Filed: Sep. 5, 2018

(86) PCT No.: PCT/FI2018/050626
§ 371 (c)(1),
(2) Date: Feb. 21, 2020

(87) PCT Pub. No.: WO2019/048736
PCT Pub. Date: Mar. 14, 2019

(65) Prior Publication Data
US 2020/0220549 A1     Jul. 9, 2020

(30) Foreign Application Priority Data
Sep. 5, 2017   (FI) .................................... 20175791

(51) Int. Cl.
H03L 1/02        (2006.01)
H03B 5/04        (2006.01)
(Continued)

(52) U.S. Cl.
CPC .............. *H03L 1/028* (2013.01); *H03B 5/04* (2013.01); *H03B 5/32* (2013.01); *H03H 9/02448* (2013.01); *H03L 7/183* (2013.01)

(58) Field of Classification Search
CPC .................................................... H03L 1/028
(Continued)

(56) References Cited

U.S. PATENT DOCUMENTS 6,831,525 B1   12/2004   Beaudin et al.
7,068,125 B2    6/2006   Lutz et al.
(Continued)

FOREIGN PATENT DOCUMENTS

JP      2014060682 A    4/2014
WO       0249203 A2     6/2002
(Continued)

OTHER PUBLICATIONS

J.C. Salvia et al., "Real-Time Temperature Compensation of MEMS Oscillators Using an Integrated Micro-Oven and a Phase-Locked Loop", Journal of Microelectromechanical Systems.
(Continued)

*Primary Examiner* — Joseph Chang
(74) *Attorney, Agent, or Firm* — Ziegler IP Law Group, LLC

(57) ABSTRACT

A frequency reference oscillator device and method of providing a frequency reference signal. The oscillator device includes a first oscillator including a first resonator having first long-term stability and a first frequency-vs-temperature turnover temperature, the first oscillator being capable of providing a first frequency signal. Further, the device includes and a second oscillator including a second resonator having second long-term stability, which is inferior to the first long-term stability, and a second frequency-vs-temperature turnover temperature, the second oscillator being capable of providing a second frequency signal. There is also provided a thermostatic controller for adjusting the temperature of the first resonator essentially to said first turnover temperature and the temperature of the second resonator essentially to said second turnover temperature, and a stability control circuit configured to use the first frequency signal for adjusting the second oscillator for
(Continued)

providing a temperature stabilized and long-term stabilized output frequency signal.

21 Claims, 7 Drawing Sheets

(51) Int. Cl.
*H03B 5/32* (2006.01)
*H03H 9/02* (2006.01)
*H03L 7/183* (2006.01)

(58) Field of Classification Search
USPC .......................................................... 331/66
See application file for complete search history.

(56) References Cited

U.S. PATENT DOCUMENTS

| | | |
|---|---|---|
| 7,248,128 B2 | 7/2007 | Mattila et al. |
| 7,268,646 B2 | 9/2007 | Lutz et al. |
| 7,427,905 B2 | 9/2008 | Lutz et al. |
| 7,545,228 B1 | 6/2009 | Lu et al. |
| 8,669,823 B1 | 3/2014 | Olsson et al. |
| 9,191,012 B2 | 11/2015 | Hsieh et al. |
| 2012/0268216 A1* | 10/2012 | Borremans ........ H03H 9/02448 331/70 |
| 2014/0292423 A1* | 10/2014 | Isohata .................. H03L 1/028 331/70 |
| 2016/0099704 A1 | 4/2016 | Jaakkola et al. |

FOREIGN PATENT DOCUMENTS

| | | |
|---|---|---|
| WO | 2007149764 A2 | 12/2007 |
| WO | 2011131839 A1 | 10/2011 |
| WO | 2016205770 A1 | 12/2016 |

OTHER PUBLICATIONS

Jaakkola, A. et al. "Piezoelectrically Transduced Single-Crystal-Silicon Plate Resonators" In IEEEUltrasonics Symposium, 2008. IUS 2008, 717-20, 2008.
Jaakkola, Antti. "Piezoelectrically Transduced Temperature Compensated Silicon Resonators forTiming and Frequency Reference Applications." Doctoral dissertation, Aalto University, 2016.
Kaajakari, V., T. et al, "Nonlinear Limits for Single-Crystal Silicon Microresonators." Journal ofMicroelectromechanical Systems 13, No. 5 (Oct. 2004): 715-24.doi:10.1109/JMEMS.2004.835771.
Y. Chen et al., "Ovenized dual-mode clock (ODMC) based on highlydoped single crystal silicon resonators".
Z. Wu et al., "A Temperature-Stable Piezoelectric MEMS Oscillator Usinga CMOS PLL Circuit for Temperature Sensing and Oven Control".
Patent Cooperation Treaty, International Search Report, Application No. PCT/FI2018/050626, dated Dec. 13, 2018, 5 Pages.
Finnish Patent and Registration Office, Search Report, Application No. 20175791, dated Apr. 5, 2018, 2 Pages.
Patent Cooperation Treaty, Written Opinion of the International Searching Authority, Application No. PCT/FI2018/050626, dated Dec. 13, 2018, 5 Pages.

* cited by examiner

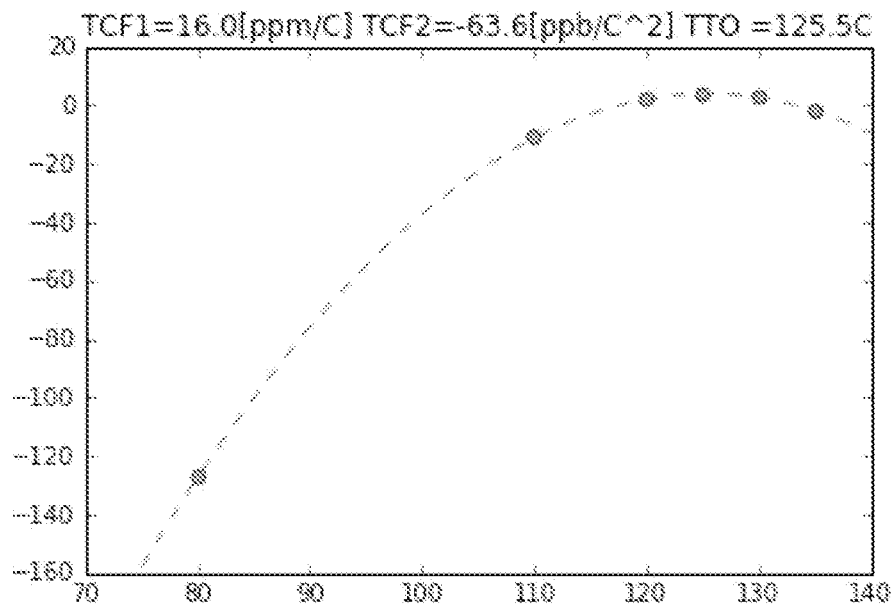
Fig. 3A
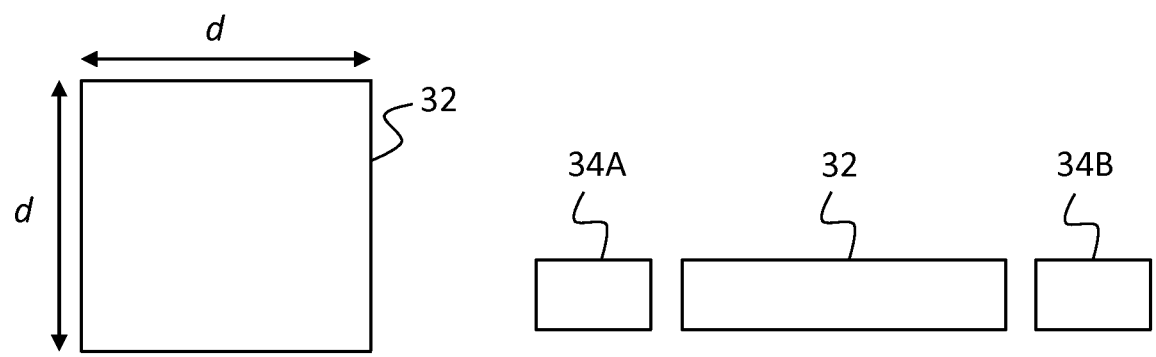
Fig. 3B
Fig. 3C

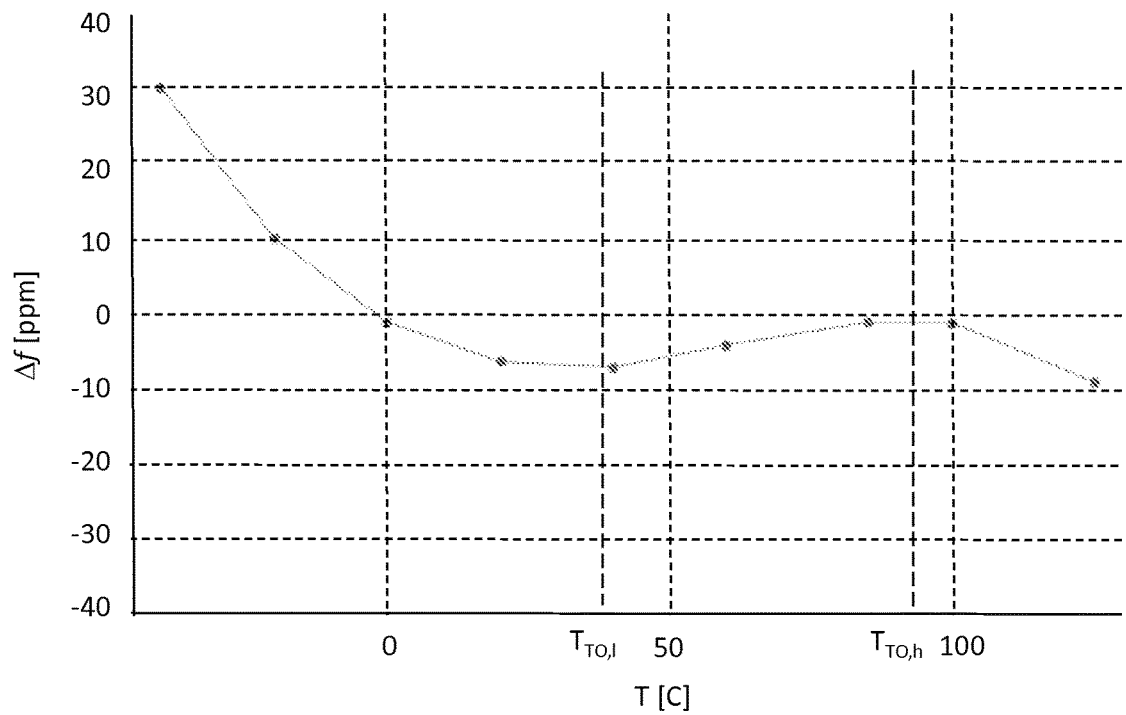
Fig. 4A
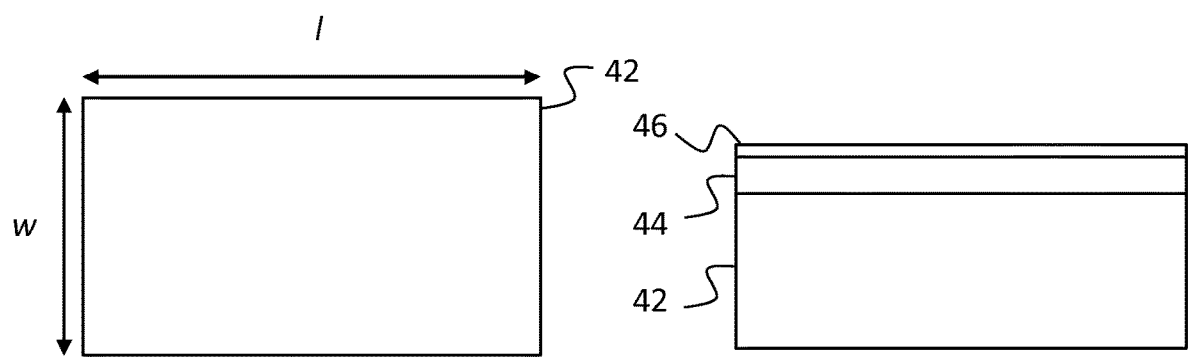
Fig. 4B
Fig. 4C

FREQUENCY REFERENCE OSCILLATOR DEVICE AND METHOD OF STABILIZING A FREQUENCY REFERENCE SIGNAL

FIELD

The aspects of the disclosed embodiments relate to frequency reference oscillators. Such oscillators are used in various electronic devices for example to provide clock signal and/or to stabilize their operation frequency. In particular, the aspects of the disclosed embodiments relate to oven-controlled microelectromechanical system (MEMS) oscillators (OCMOs).

BACKGROUND

Traditionally frequency reference oscillators contain a quartz crystal as resonating element, which mainly determines the frequency and other properties of their output signal. Quartz crystals are stable but also suffer from some drawbacks such as relatively large size and high power demand.

Several attempts have addressed the issue of using a MEMS resonator, as an alternative to quartz resonator, as a stable frequency reference. There are two main technical problems in realizing a practical frequency reference based on this approach. First, a MEMS resonator with a suitable resonant frequency vs. temperature characteristic tends to have a low power handling capability. MEMS resonators may have a nonlinear response even at a moderately low driving level. This means also that the value of the resonant frequency depends strongly on the driving amplitude. Reaching a good phase noise, on the other hand, requires a high-enough drive level, as discussed e.g. in Kaajakari, V., et al, "*Nonlinear Limits for Single-Crystal Silicon Microresonators.*" *Journal of Microelectromechanical Systems* 13, no. 5 (October 2004): 715-24. It is therefore difficult to realize a stable output frequency with a good phase noise in the same time.

Another problem in realizing a practical MEMS-based frequency reference is to have an output frequency accurate to a few parts-per-million (ppm) because the variation in the resonant frequencies of MEMS resonators can be easily on the order of 1000 ppm.

The basic idea of oven-controlled Quartz and MEMS oscillators (OCXOs and OCMOs) is to operate their resonator elements at a constant, elevated temperature. The operation temperature is chosen so that it gives the maximum stability for the oscillator.

U.S. Pat. No. 7,068,125 B2, U.S. Pat. No. 7,427,905 B2, U.S. Pat. No. 7,268,646 B2 disclose various realizations of a MEMS resonator which are operated at a predefined temperature by using a heating element which is formed in the MEMS resonator die, in close proximity of the mechanically resonating structure.

U.S. Pat. No. 8,669,823 B1 discloses a lateral contour mode ovenized micro-electro-mechanical system (MEMS) resonator and electrode structure for electromechanical coupling. While such an approach can be used to realize a low-power temperature controlled oscillator, the approach has technical problems in providing an oscillator output frequency insensitive to changes in the environmental temperature and drifts upon ageing.

U.S. Pat. No. 7,248,128 B2 discloses a MEMS reference oscillator which comprises of a group of MEMS resonators and a circuit to select desired properties from the group resonators. A disadvantage in this approach is that the resonant frequency of the resonators therein is sensitive to changes in temperature. To compensate for the temperature effect, the document discloses a method involving the use of a frequency meter that that monitors the frequency of the one resonator using a reference resonator, measures the temperature of the reference oscillator, and takes the temperature of the reference resonator into account when adjusting the frequency of the oscillator to a desired value. Also the use of a bank of several resonators having different resonance frequencies, from which one is chosen for output by a selection circuit is disclosed, as well as a technique involving frequency summing of two oscillators, one of which is a tunable low-frequency oscillator for temperature compensation purposes, the other being a high-frequency oscillator.

U.S. Pat. No. 9,191,012 B2 discloses another temperature compensated oscillator comprising a group of MEMS resonators in which one of the resonators is used to provide the output frequency of the oscillator, one of the resonators provides a frequency which is used to sense the temperature of the group of resonators, and a heating device, controller and connecting device to provide a temperature-insensitive oscillator frequency by controlling the heater based on the difference of two resonant frequencies. US 2007/290763 A1 discloses another method the use of several resonators for providing an oscillator having a temperature-compensated output frequency.

These compensation schemes referred to above suffer from relatively low temperature stability, since they rely on resonators whose temperature drift is typically several hundreds or even thousands of ppm, and even at their best tens of ppm, over the standard temperature range of $-40 \ldots +85°$ C. Despite the various compensation mechanisms, this fact necessarily causes a significant variability in the output frequency of the oscillator.

Realization of a high-accuracy, low temperature drift and temporally stable frequency references based on MEMS resonators faces technical challenges, which cannot be addressed based on above-mentioned disclosures. In particular, in order for oven controlled MEMS oscillators (OCMOs) to widely replace oven-controlled quartz oscillators (OCXOs) as frequency references, their stability needs to be further improved.

SUMMARY

The aspects of the disclosed embodiments are directed to provide a frequency reference oscillator device, which is improved in terms of stability and in particular long-term temporal stability.

Further aims include providing a stable, temperature-insensitive frequency reference oscillator device based on MEMS resonators with good phase-noise performance and accurate definition of the output frequency.

The aims are achieved as herein described and claimed.

According to one aspect, the disclosed embodiments provide a frequency reference oscillator device comprising
  a first oscillator comprising a first resonator having first long-term stability and a first frequency-vs-temperature turnover temperature, the first oscillator being capable of providing a first frequency signal,
  a second oscillator comprising a second resonator having second long-term stability, which is inferior to the first long-term stability, and second frequency-vs-temperature turnover temperature, the second oscillator being capable of providing a second frequency signal, a thermostatic controller for adjusting the temperature of the first resonator essentially to said turnover temperature and the second resonator essentially to said second turnover temperature, and a stability control circuit configured to use the first frequency signal for adjusting the second oscillator for providing a temperature stabilized and long-term stabilized output frequency signal.

According to a further aspect of the disclosed embodiments, there is provided a method of stabilizing a frequency reference signal, the method comprising providing first and second resonators as described above, using the thermostatic controller for heating the first resonator to said first turnover temperature, and the second resonator to the second turnover temperature, and using the first frequency signal to adjust the second oscillator for providing a stabilized output frequency signal.

The aspects of the disclosed embodiments offer significant benefits.

First, an oscillator is provided whose output frequency is both temporally stable and has low temperature drift. The proposed temperature compensation is not based on measurement of frequency of the first or the second resonator, and neither any differential frequency measurement of two or more resonators, whereby no errors arising from such measurements are seen. That is, in the present design, the thermostatic control of the temperature of the first resonator can be entirely independent on the frequencies of the first and second resonators. Temporal stability herein includes both high long-term stability and good retrace characteristics.

Due to the thermostatic control, the proposed oscillator is also independent of ambient temperature.

The aspects of the disclosed embodiments allow the use of MEMS resonators as both the first and the second resonators. This means that oscillators with smaller size and lower power consumption can be realized.

It has been found that a long-term stability of less than 1 ppm/year can be achieved by the present design. Further, the so-called retrace of an oscillator, i.e. how well the oscillator repeats its frequency after a period of being powered off, if 20 ppb and less has been found to be achievable. These values are, in particular, achievable by choosing as the first resonator for example an electrostatically actuated single-crystal MEMS resonator, which is degenerately doped and heating the first resonator to a suitable temperature using a thermostatic independent of the frequencies of the first and second resonators, one can achieve temperature drift and long-term stability of the order of quartz crystals and even better. The first resonator stabilizes the operation of the second resonator, which can be chosen relatively freely. For example, the second resonator can be a "fast" MEMS resonator having low phase noise characteristics in the operating frequency range of the oscillator. In particular, the use of a highly doped piezoelectrically actuated resonator as the second resonator provides advantages in respect of low noise, high intrinsic stability, and the ability to "push" the turnover point of the resonator to above 85° C. It is however also possible that the second resonator is a quartz resonator.

The dependent claims are directed to selected embodiments of the aspects referred to above and provide further benefits.

In some embodiments, the stability control circuit is adapted to use the first frequency signal and a feedback loop utilizing the second frequency signal for adjusting the frequency of the second oscillator. The first oscillator provides a stable basic frequency, whereas the feedback loop allows for immediate correction of frequency changes, which originate from the properties and temperature changes of the second resonator. Thus, the second frequency signal can be used a stabilized output signal of the oscillator. The stability control circuit can be based e.g. on a phase-locked loop circuit or a microcontroller.

In some embodiments, the thermostatic controller is functionally independent of the first and the second frequency signals. That is, temperature of the resonators is neither determined nor adjusted based on the frequencies of the output frequencies of the resonators e.g. by differential measurement. Instead of that, there may be provided thermistors or the like direct temperature sensors in the vicinity of the resonators. This allows for maximal accuracy and minimal drift of the output frequency of the oscillator.

In some embodiments, the stability control circuit is functionally independent of the temperature of the first resonator. This means that the stability control circuit does not require or use the temperature data for performing its function of stabilizing the second resonator based on the output of the first oscillator. In other words, the stability control circuit "accepts" the first frequency signal as such as a control signal.

In some embodiments, the stability control circuit is configured to operate the first resonator and to use the first frequency signal intermittently for said adjusting of the second resonator. Thus, the first oscillator is not switched on all the time but only at intervals so as to make a corrective tuning of the second oscillator, after which the first oscillator is switched off. This reduces the power consumption of the device. Also the thermostatic heating of the first resonator can be synchronized with these switch-on periods so as to further reduce power consumption.

In some embodiments, the first resonator is a degenerately doped single-crystal MEMS resonator, typically comprising n-type doping agent. In particular, it may be an electrostatically actuated single-crystal silicon resonator. Thus, the first oscillator may comprise a degenerately doped single-crystal silicon body, electrostatic transduction electrodes functionally coupled to the body, and an actuator that is electrically connected to the electrodes for exciting a desired resonance mode in to the resonator.

In some embodiments, the second resonator is a degenerately doped piezoelectrically actuated composite MEMS resonator. Such resonator may comprise a silicon body, preferably having an n-type dopant concentration of $1.3*10^{20}$ cm$^{-3}$ or above, a piezoelectric transduction layer, such as an aluminum nitride layer, on the body, and an electrode layer on the piezoelectric layer. The actuator of the oscillator is electrically connected to the electrode layer and to the silicon body for exciting a desired resonance mode in to the resonator.

In some embodiments, the resonator element is a plate element, such as a rectangular plate element, with an in-plane aspect ratio different from 1.

In some embodiments, the first oscillator, the second oscillator, or both oscillators comprise as their respective resonators a resonator comprising silicon doped to an average doping concentration of at least $9*10^{19}$ cm$^{-3}$. In addition, there is provided an actuator for exciting the resonator into a resonance mode having a characteristic frequency-vs-temperature curve having a high-temperature turnover point at a turnover temperature of 85° C. or more. It has namely been found that the turnover point of a silicon resonator can be "pushed" to a high enough temperature to serve as an ovenization temperature to cover the whole practical temperature region of electronic devices and simultaneously flattening the turnover point to provide a very stable spot in terms of frequency. A key to this is the ultra-high doping concentration of the silicon material. Preferred material, resonator geometry and resonance mode combinations are exemplified later. In particular, it has been shown that the absolute value of the curvature of the frequency-vs-temperature curve at the turnover point is brought to the level of 20 ppb/$C^2$ or less, and even 10 ppb/$C^2$ or less. This is contrast to conventional ovenized resonators, in which the curvature is even at best in the order of 50 ppb/$C^2$, which is more than 10 times worse than that in quartz crystals used in OCXOs. The present configuration brings the curvature, and thus the frequency stability, close to the quartz performance. This relieves the requirements of oven temperature control accuracy.

In further embodiments, the doping concentration of the respective resonator is at least $1.1*10^{20}$ cm$^{-3}$ and the frequency-vs-temperature curve has two turnover points, one of which is the high-temperature turnover point, which serves as the ovenization point. It has namely been found that some resonators that were previously believed to have a frequency-vs-temperature turnover point at a relatively low temperature, actually exhibit another turnover point at a high temperature when doped to such level. Importantly, this another turnover point has low curvature, which makes it ideal for ovenization in order to stabilize the output frequency of the oscillator. The other turnover point may also be a high-temperature point or a low-temperature turnover point located at a temperature of less than 85° C.

In some embodiments, the resonance mode of the first and/or second resonator is in square extensional/width extensional mode branch (including overtones). In an alternative embodiment, the resonance mode is in the in-plane flexural, out-of-plane flexural, or length extensional/Lame modal branch (including overtones). This means that the main mode that arises in the resonator belongs to the mentioned branch.

In general, the resonance mode used can be an extensional mode, such as a width extensional mode or square extensional mode, flexural mode, such as an in-plane flexural mode, a shear mode, or a mode having characteristics from two or more of these modes. These mode shapes in particular have been found to provide desired designs of freedom, in particular with respect to the aspect ratio of the plate, angle of the plate with respect to the silicon crystal, and doping, so as to be able to realize the resonator with the desired properties in practice.

The abovementioned resonance modes are particularly beneficial in combination with a high silicon doping level of $9*10^{19}$ cm$^{-3}$ or more, such as $1.1*10^{20}$ cm$^{-3}$ or more, since this allow for achieving very low curvature of the frequency-vs-temperature curve at the ovenization temperature.

In some embodiments, the first resonator, and typically also the second resonator, has a turnover temperature of 85° C. or more. The turnover temperatures may be set equal, whereby a single oven is sufficient, but they may also be different, whereby the resonators are separately ovenized.

In some embodiments, the second resonator is a composite MEMS resonator. It can be for example an aluminum nitride thin film actuated degenerately doped silicon resonator, where the silicon crystal and the AlN layer, and any optional electrode or other layers, form the composite. This kind of a resonator has very low phase noise, accurately tunable center frequency and advantageous frequency stability characteristics.

In some embodiments, the second oscillator has lower characteristic phase noise than the first oscillator when the frequency offsets from the respective carrier frequencies are above a certain frequency, say 100 Hz, offset from the respective carrier. Due to the present configuration, the output signal has essentially the noise characteristics of the second oscillator and stability characteristics of the first oscillator.

In some embodiments, the second turnover temperature is substantially different, in particular at least 5° C. different, from the first turnover temperature. The resonators can be placed in separate ovens and one can therefore relatively freely choose the design and optimal points of operation for the two resonators. In alternative embodiments, the resonators are configured such that the second turnover temperature is substantially equal to the first turnover temperature, in particular differing at most 5° C. therefrom, and the thermostatic controller is adapted to adjust the temperatures of the first and second resonator essentially to the same temperature. This has the advantage that the resonators can be placed in a single oven.

Next, selected embodiments of the present disclosure and advantages thereof are discussed in more detail with reference to the attached drawings.

BRIEF DESCRIPTION OF THE DRAWINGS

FIG. 3A shows a graph of measured temperature dependency of a resonant frequency of an electrostatic Lame-mode MEMS resonator showing a turn-over temperature higher than 85° C. ($T_{TO}$=125° C.).

FIGS. 3B and 3C show in top and side views an exemplary electrostatically actuated square plate resonator suitable as the first resonator.

FIG. 4A illustrates measured temperature dependency of a resonant frequency of an aluminum-nitride thin-film coupled MEMS resonator showing a turn-over temperature higher than 85° C. ($T_{TO,h}$=95° C.).

FIGS. 4B and 4C show in top and side views an exemplary piezoelectrically actuated rectangular plate resonator suitable as the second resonator.

DETAILED DESCRIPTION OF EMBODIMENTS

Definitions

"(Frequency reference) oscillator (device)" herein refers to the whole device including in particular the first and second oscillators, the thermostatic controller and the stability control circuit as herein described.

"First/second oscillator" refers to separate sub-units contained in the oscillator device, containing separate first/second resonators and actuators therefor.

"Actuator" herein refers to necessary driving and sensing circuitry for operating the resonator and to sensing the frequency of the resonator.

"Resonator (element)" herein refers to a solid-state element suspended to a supporting structure so as to be capable of resonating in a resonance mode. A resonator may in particular be a single-crystal resonator or a composite resonator comprising e.g. layers having different material compositions, such as layers, as required e.g. by piezoelectric actuation, and suspended with the element body.

"Long-term stability" refers to the change of the oscillator's output frequency over time. The term "aging" can be used as a synonym for long-term stability. The period of time of interest can be a day, month, year or several years, whereby aging performance is typically given in units of ppb/day, ppb/month, ppb/year, for example, or as ppm/day, ppm/month, ppm/year, for example.

"Retrace" represents how well an oscillator repeats its frequency after a period of being powered off. Retrace is typically measured in units ppb or ppm.

TCF1, TCF2 and TCF3 refer to first, second and third order derivatives of the frequency-vs-temperature curve, respectively, typically evaluated at a temperature of 25° C. Terms "slope" and "curvature" are used when referring to the first and second derivatives of the frequency-vs-temperature curve at the turnover temperature.

Here "ppb" and "ppm" refer to relative units of parts per billion ($10^{-9}$) or parts per million ($10^{-6}$), respectively.

"Turnover point" refers to a local extremum of the frequency-vs-temperature curve of a particular resonator. A turnover temperature (Tip) is the corresponding temperature value of the turnover point. Thus, at the turnover temperature, slope of the frequency-vs-temperature curve of the resonator is zero, whereby in the vicinity of a turnover temperature, changes in temperature are minimally reflected in the frequency of the resonator.

"Degenerate doping" herein means doping to an impurity concentration of $10^{18}$ cm$^{-3}$ or more, in particular $9*10^{19}$ cm$^{-3}$ or more, and even $1.1*10^{20}$ cm$^{-3}$ or more. The doping agent can be e.g. phosphorus or some other n-type agent.

Description of Selected Embodiments

General Architecture

Figure 1:
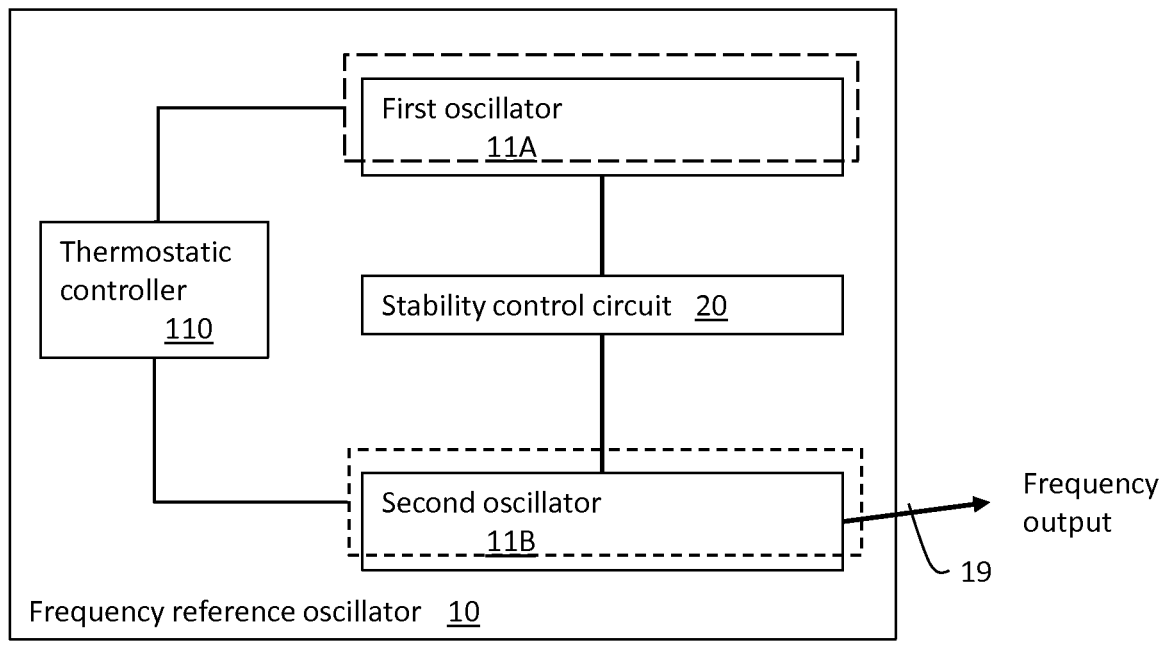
FIG. 1 shows a block diagram of a MEMS-based frequency reference oscillator according to one embodiment.

FIG. 1 illustrates in a general level the architecture of a frequency reference oscillator 10 based on MEMS resonators. A first oscillator 11A and a second oscillator 11B are both functionally connected to a stability controller circuit 20 ("combiner"). The output frequency is obtained from the output of the second oscillator 11B. One of the main purposes of the stability control circuit is to improves the long-term stability of the second oscillator to the stability level of the first oscillator.

The first oscillator 11A contains a first resonator element that is chosen to have high long-term stability and TCF characteristics exhibiting a turnover temperature $T_{TO,1}$ outside the intended ambient operating temperature range of the oscillator. The first oscillator, or at least the resonator element thereof, is thermally insulated (dashed line in FIG. 1) from its surroundings and ovenized using a thermostatic controller 110 to the turnover temperature $T_{TO,1}$. Then, the first resonator is excited with a suitable drive circuit and its resonance frequency is sensed and provided to the stability control circuit.

It is notable that the thermostatic controller 110 is arranged to operate separately from the drive circuits of the first and second oscillators 11A, 11B and the stability control circuit 20. That is, the it does not use either of the frequencies of the oscillators 11A, 11B for determining the target temperature of the first resonator and, optionally, the second resonator, if ovenized).

The long-term stability of the first oscillator 11A is preferably 10 ppb/day or less, such as 5 ppb or less. This is achievable for example using an ovenized degenerately doped electrostatically actuated single-crystal MEMS resonator.

The resonant frequency of the first resonator 11A can be different from the desired frequency output.

The frequency output is obtained from the second oscillator 11B. The stability control circuit uses the output signal of the first oscillator 11A to control drive circuit of the second oscillator 11B to tune the frequency of the second oscillator 11B to a desired value. The temperature-insensitive first oscillator 11A keeps this value maximally constant over time.

The second oscillator 11B is also thermally isolated and ovenized using the thermostatic controller 110. This provides maximum thermal stability.

The small sizes of MEMS resonators make it possible to realize micro ovens with very low power consumption. It is therefore possible to make a reference oscillator comprising two oven-controlled MEMS resonators and still achieve a power consumption significantly lower than in the state-of-art oven-controlled crystal oscillators based on quartz.

In one embodiment, the second resonator contained in the second oscillator 11B is a degenerately doped composite MEMS resonator, which is ovenized to its specific turn-over temperature $T_{TO,2}$. Typically, $T_{TO,2}$ is different from $T_{TO,1}$ and the second resonator is separately insulated, i.e., the resonators are positioned in separate micro ovens in order to achieve the target temperatures independent of each other. This makes also the second oscillator 11B temperature-insensitive, increases the stability of the whole oscillator, and allows for using a stability control circuit with longer time constants or tuning intervals.

The second resonator can be a piezoelectrically actuated, in particular an AlN-coupled composite resonator.

In some embodiments, the second oscillator 11B is chosen to have a lower phase noise than the first oscillator 11A. This makes the reference oscillator fast, i.e. shortens the period over which signal filtering or averaging is needed in order to determine the output frequency. AlN-coupled silicon MEMS resonators are of particular interest in this respect. However, currently the long-term stability of AlN-coupled MEMS resonators is not as good as the long-term stability of single-crystalline electrostatically actuated MEMS resonators. However, by controlling the second oscillator 11B using the first oscillator 11A and the stability control circuit 20, A MEMS-based reference oscillator with optimal properties can be realized.

In some embodiments, also the driving and sensing circuitry (not shown) of the first and/or second oscillators 11A, 11B is heated to a predefined constant temperature by thermostatic control. This maximizes the stability of the output frequencies of the oscillators 11A, 11B, and further the whole frequency reference oscillator. The heating oven or ovens for the driving circuitry need not be as stable as those for the first, and optionally for the second, oscillator.

Stability Control Circuit

Figure 2A:
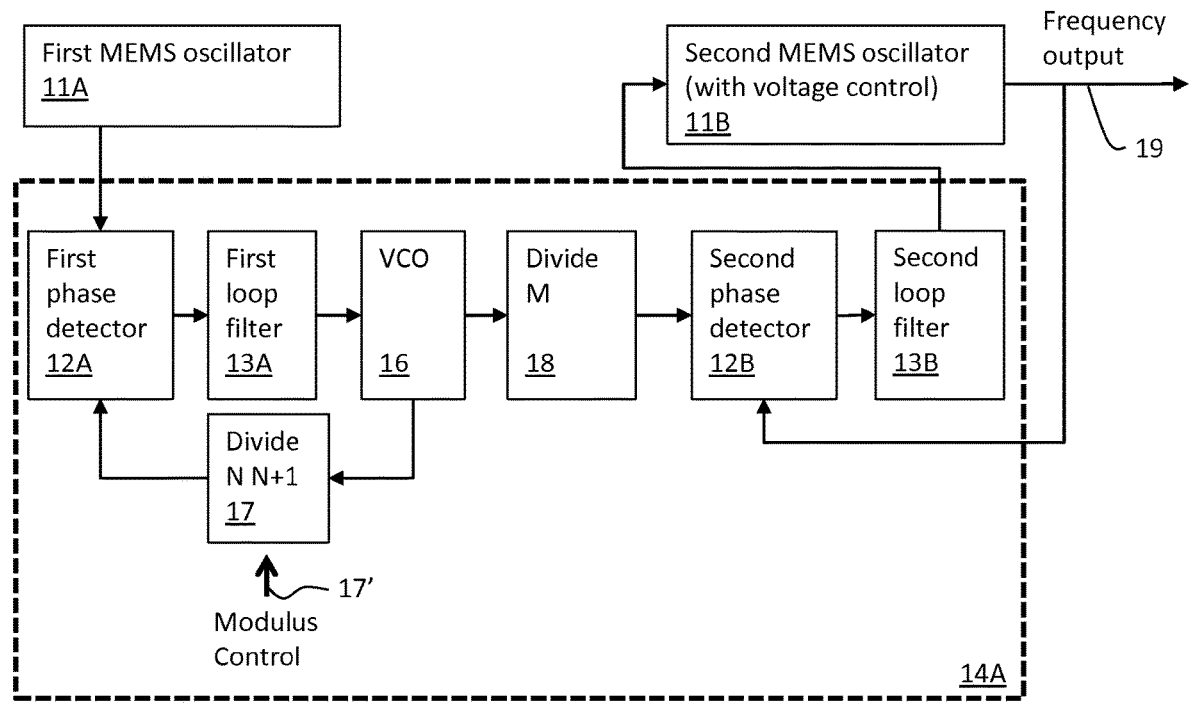
FIG. 2A illustrates a block diagram of a MEMS-based frequency reference oscillator with a fractional-N PLL circuit to stabilize the output oscillator against long-term ageing according to one embodiment.

There are several electrical circuits for implementing a suitable stability control circuit. FIG. 2A illustrates a frequency reference in which the circuit makes use a fractional-N phase-locked-loop (PLL) circuit. By the PLL circuit, frequencies of the two oscillators 11A, 11B can be locked to each other. A feedback loop from the output of the second oscillator 11B to the PLL circuit is provided to eliminate the long-term ageing of the output frequency of the oscillator.

In more detail, in the fractional-N PLL circuit, the frequency signal of the first oscillator 11A is led to a first phase detector 12A, whose output is connected to a first loop filter 13A. The filtered signal is led further to a voltage-controlled oscillator (VCO) 16, from which there is an internal feedback loop through a fractional integer N N+1 divider 17 back to the first phase detector 12A. Modulus control 17' is provided to control the divider 17.

Output of the VCO 16 is directed through an integer M divider 18 to a second phase detector 12B and further to a second loop filter 13B, which is used as the input for tuning the frequency of the second oscillator 11B. The output of the second oscillator 11B serves as the frequency output of the whole oscillator.

Long-term ageing of the second oscillator 11B is minimized by a feedback loop which connects the output of the second oscillator 11B back to the second phase detector 12B. Long-term stability of the whole reference oscillator is then determined by the stability of the first oscillator 11A.

The oscillator architecture illustrated in FIG. 2A has a significant advantage over traditional fractional-N PLL oscillators. In comparison to such oscillators, the output frequency signal 11B does not suffer from the spurious noise and the phase noise can be significantly better.

As concerns long-term stability, the feedback loop can usually be very slow because frequency drift is a long-term phenomenon. Over short time periods, the output frequency of for example AlN-coupled MEMS resonator usable in the second oscillator 11B can be sufficiently stable.

Figure 2B:
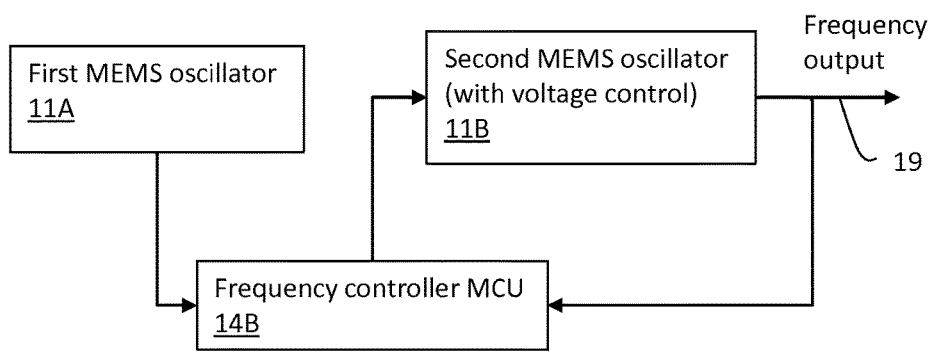
FIG. 2B illustrates MEMS-based frequency reference oscillator with a microcontroller-based frequency counter to stabilize the output oscillator against long-term ageing according to one embodiment.

FIG. 2B shows an alternative configuration, in which a microcontroller unit (MCU)-based frequency counter 14B and a feedback loop to stabilize the second oscillator 11B against long-term ageing.

Tuning of the frequency of the second oscillator 11B by the stability control circuit can be implemented, for example, by loading the oscillator with a varactor to create "frequency pulling" similarly to the practices in the industry for quartz crystals, and by controlling the capacitance of the varactor using the feedback voltage of the stability control circuit.

One of the advantages of the architectures illustrated in FIGS. 2A and 2B is that it is not necessary to fabricate a first resonator 11A with a resonant frequency falling in a predetermined, narrow frequency range. Fabrication of a second resonator 11B according to a tight frequency specification is significantly easier at least in the case of AlN-coupled MEMS resonators.

Power consumption of the reference oscillator can be reduced if the first oscillator 11A and/or the stability control circuit 20, 14A, 14B is switched on only intermittently to calibrate the second oscillator 11B. Suitable switch-on interval depends on the frequency drift characteristics of the two oscillators 11A and 11B. The goal is to do the calibration sufficiently often that the long-term drift of the second oscillator 11B can be reduced to the low drift level of the first oscillator 11A.

The first oscillator 11A and most of the circuit blocks of the stability control circuit 20, 14A, 14B and the thermostatic controller 110 form a frequency calibrator which is used to calibrate the frequency of the second oscillator 11B, which is less stable than the first oscillator 11A. The result of the calibration is stored, for example, into a digital circuit block used to control the analogue voltage of a digital-to-analogue converter which is the tuning voltage determining the output frequency of the second oscillator 11B.

In some embodiments, the switch-on interval is on the order of hours or days, such as 1 hour-10 days. The duration of a switch-on period may be e.g. 10 seconds-10 minutes.

In some embodiments, the frequencies of the first oscillator and the second oscillator are related by a simple equation $f_2=(M/N) f_1$ where M and N are integers. The stability control circuit becomes then a PLL circuit with only integer dividers. In the simplest case $f_2=f_1$. The basic advantages of the aspects of the disclosed embodiments hold also in this case: the phase noise of the whole frequency reference oscillator is determined by the second oscillator while the long-term stability is assured by the first oscillator.

First Resonator

According to one embodiment, the first resonator contained in the first oscillator 11A is a degenerately doped electrostatically actuated single-crystal MEMS plate resonator oscillating in Lame mode or a beam resonator oscillating in LE (length extensional) mode. By choosing the doping concentration of the crystal and orientation of main axes of the plate/beam resonator with respect to the crystal direction suitably, a preferred turnover temperature of higher than 85° C., such as higher than 100° C., is achieved.

According to specific examples, the first resonator comprises a LE beam or Lame square resonator with n-type, such as phosphorus dopant concentration of $4.1*10^{19}$ cm$^{-3}$ or more, and angle of 0-45 degrees with respect to the [100] crystal direction.

Another type of MEMS resonator geometry that can be used as the first resonator can be a degenerately doped electrostatically actuated single-crystal MEMS plate resonator oscillating in the width extensional resonance mode.

FIG. 3A shows an example of measured temperature dependency of the resonance frequency of such MEMS resonator at high temperatures. The curve has a turn-over point at 125° C. The temperature of the micro oven where resonator is located is set to this temperature by the thermostatic controller. Thus, any changes in the temperature have a minimal change in the output frequency of the resonator.

FIGS. 3B and 3C illustrate an exemplary square plate resonator plate 32, having electrostatic actuator electrodes 34A, 34B provided on lateral sides thereof separated by a gap. Electrostatic coupling is preferred for the first resonator due to the absence of mechanical contact and therefore no stresses induced to the crystal by the drive or sense means of the resonator. Typically, inferior phase noise compared with mechanically coupled resonators does not matter in the present configuration, as the phase noise of the oscillator is determined by the properties of the second resonator.

There are also other resonator topologies and resonance modes, which can be used to realize MEMS resonators with suitable frequency-vs-temperature characteristics.

In some embodiments, the first resonator is of the kind described below with reference to the second resonator, but is electrostatically actuated to ensure high stability (whereas the second resonator is typically piezoelectrically actuated). In particular, the first resonator can be one doped to above $9*10^{19}$ cm$^{-3}$ or above $1.1*10^{20}$ cm$^{-3}$ in order to form a low-curvature turnover point above 85° C.

Figure 6:
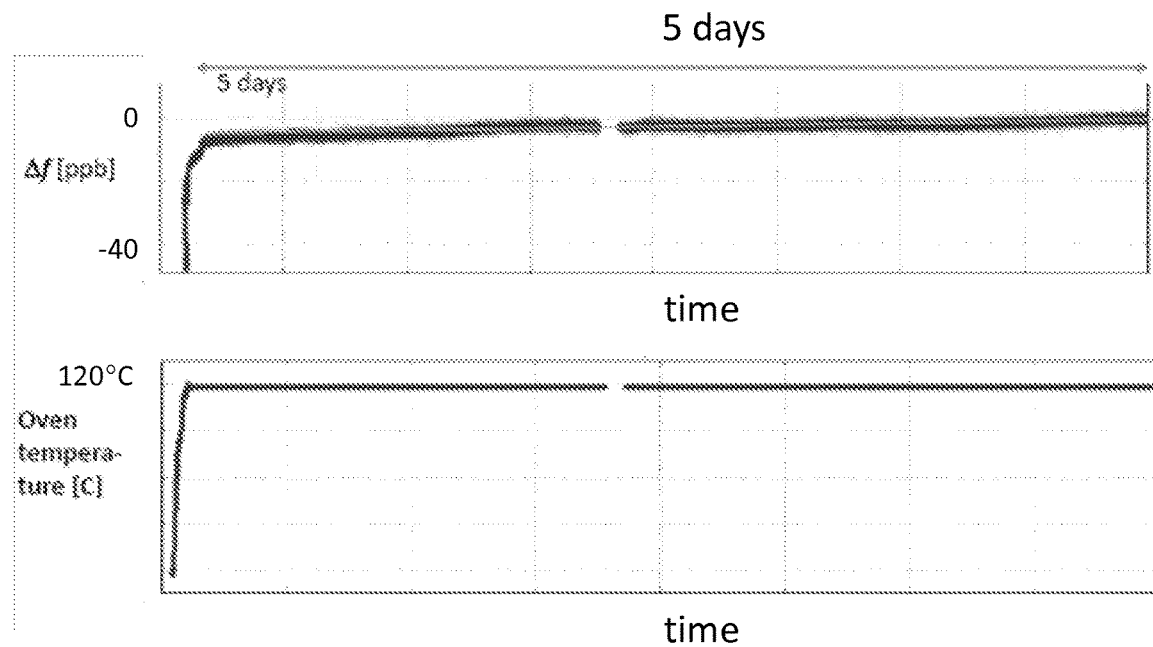
FIG. 6 shows frequency stability measurement data of an oscillator based on an electrostatic Lame-mode MEMS resonator.
Figure 7:
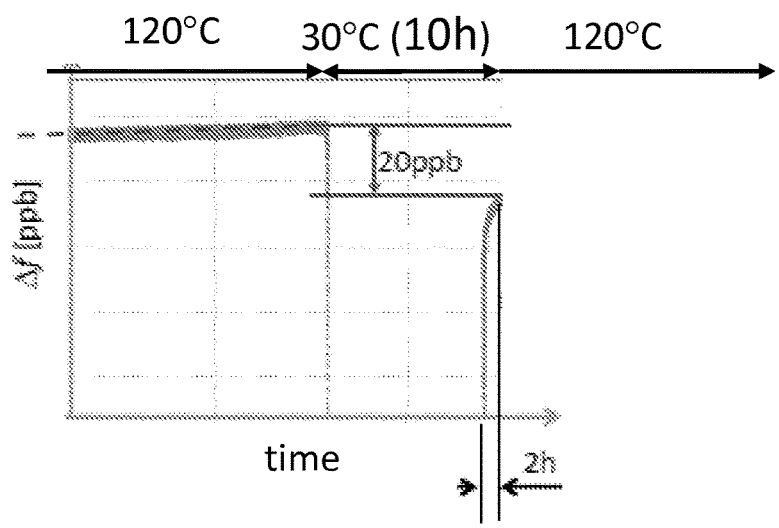
FIG. 7 shows retrace measurement data of an oscillator based on an electrostatic Lame-mode MEMS resonator.

FIG. 6 shows frequency measurement and oven temperature (constant at turn-over temperature of 120° C.) of an electrostatically coupled Lame-mode resonator. An aging performance of approximately 1 ppb/day is seen. FIG. 7 shows a retrace measurement of a similar resonator. A retrace performance of approx. 20 ppb is seen. These figures demonstrate the industrial applicability and good performance of the present Second Resonator According to one embodiment, the second resonator contained in the second oscillator 11B is one with a stronger electromechanical coupling between its actuator and main resonating element than that of the first resonator, in which the coupling is preferably based on electrostatic interaction. This way, the phase noise can be reduced. In practice, composite resonators with a thin film actuator layer superimposed on a silicon body provide strong coupling and low phase noise when the resonator is used as a part of an oscillator. The thin film is typically a piezoelectric AlN layer on top of which there is an additional electrode layer. The silicon body can serve as another electrode.

FIG. 4A shows an example of a frequency-vs-temperature curve measured from a rectangular plate resonator. It is notable that the illustrated curve herein has two turnover temperatures, one at about 40° C. and one at about 95° C. The latter one is chosen as the target temperature of the oven.

FIGS. 4B and 4C illustrate an exemplary rectangular resonator plate 42, having a piezoelectric layer 44 and electrode layer 42 superimposed thereon. The plate has a length/and width w perpendicular to the length. In some embodiments, there are also provided one or more additional layers in the second resonator. Such additional layer can be e.g. a layer of passivation material, which, when processed on top of other layers can make the underlying materials chemically inactive.

It is possible to trim the resonant frequency of an AlN-coupled MEMS resonator during manufacturing in a way similar to the practices in the industry for quartz crystal resonators.

Piezoelectric actuation as such is discussed more extensively e.g. in publication Jaakkola, A. et al. *"Piezoelectrically Transduced Single-Crystal-Silicon Plate Resonators."* In *IEEE Ultrasonics Symposium,* 2008. IUS 2008, 717-20, 2008.

The resonator can be e.g. shaped as a plate, such as a rectangular plate or a beam. The length direction of the plate or the beam may be at an angle of 0-45 degrees with respect to the [100] crystalline direction of the silicon material. Both these geometric parameters, i.e. the aspect ratio and the angle, can be adjusted, together with material parameters and the modal branch or branches used, so as to yield a turnover temperature higher than 85° C.

The design and fabrication process of the present oscillator may comprise, in any relevant order or in an iterative process, the steps of choosing a resonator geometry, choosing a resonator material comprising doped silicon, and choosing actuation means capable of making the resonator to oscillate in a chosen resonance mode. For example, one can first choose any resonance mode that as such exhibits a frequency-vs-temperature curve with a positive TCF1. In one example, a plate geometry length extensional mode (first or any higher-order LE mode) is chosen. Then, one can choose plate geometry and/or plate material (stack) that brings the TCF1 zero or close to zero. For example, one can select the plate aspect ratio and/or angle with respect to the silicon crystal, and/or thickness of a piezoelectric actuation layer on top of the silicon plate. Finally, a doping concentration of silicon is chosen that makes the second and third order behaviour of the resonator dominant over the first-order behaviour. In particular, a concentration above $9*10^{19}$ cm$^{-3}$ is chosen.

Then, it is evaluated whether the resonator geometry, resonator material, actuation means and resonance mode chosen produce a frequency-vs-temperature curve having at least two turnover points, at least one of which is a high-temperature turnover point at a high turnover temperature of 85° C. or more. Evaluation may be based on simulations or experiments. In the affirmative case, an oscillator with such resonator is fabricated, also providing into the oscillator a thermostatic controller for keeping the temperature of the resonator element at the high turnover temperature.

In some embodiments, the resonance mode is chosen such that when the in-plane aspect ratio of the plate resonator (i.e. the ratio of the plate resonator's length to its width) and/or its angle with respect to the [100] crystal direction of the silicon material is varied, the characteristics of the resonator change as a function of the aspect ratio and/or the angle. Characteristics of interest are, for example, the resonance frequency and the temperature coefficients of frequency, i.e. TCF1, TCF2 and higher order coefficients, and the electromechanical coupling strength of the transducer used for excitation and sensing. Of the various possible aspect ratios or angles, one is chosen that yields the high turnover temperature together with other design parameters.

To mention some practically feasible examples, the resonator can be a composite width extensional/square extensional resonator in which the aspect ratio or a composite in-plane flexural/length extensional plate or beam resonator, is chosen, along with other parameters, to yield the high turnover temperature. These examples are discussed below in more detail.

Jaakkola, Antti. *"Piezoelectrically Transduced Temperature Compensated Silicon Resonators for Timing and Frequency Reference Applications."* Doctoral dissertation, Aalto University, 2016 and US 2016/0099704 discuss in general the second order temperature behaviour of resonators below 85° C. The second order temperature coefficient TCF2 of a silicon resonator can attain at room temperature positive values, when the n-type dopant concentration is above about $1.1*10^{20}$ cm$^{-3}$. The linear TCF (TCF1) and the second order temperature coefficient TCF2 can be made simultaneously very close to zero with certain configuration concerning the doping level and resonator geometry, and when doping is still increased, TCF2 reaches positive values, which is seen as an upward opening parabola in the frequency-vs-temperature curve between −40 . . . +85° C. It has, however now been found that at high temperatures, above 85° C., the curve deviates from the upward opening parabola and "bends down". In other terms, the frequency-vs-temperature curve is not fully described by a second order polynomial, but has considerable third order characteristic. This third order effect, or "bending down" of the frequency-vs-temperature curve, results in a low-curvature local maximum on the frequency-vs-temperature curve above 85° C., like shown in FIG. 4A, making the resonator suitable for ovenization to stabilize its frequency over the ambient temperature range of a variety of electronic products.

Exemplary approaches are presented below for obtaining frequency-vs-temperature characteristic curve having two turnover points for a silicon resonator. The approaches are thus applicable for resonators having an average dopant concentration of $1.1*10^{20}$ cm$^{-3}$ or higher, in particular $1.3*10^{20}$ cm$^{-3}$ or higher, and which may or may not have additional material layers such as piezoelectric and metal layers related to piezoelectric actuation. The approaches are based on utilizing the characteristics of width extensional/square extensional (WE/SE) and in-plane flexural (IFP1), out-of-plane flexural (OPF1), or length extensional/Lame (LE/Lame) modal branches (as referred to in the abovementioned dissertation).

The WE/SE branch: There is a square extensional/width extensional mode branch for plate resonators having a length and a width. By moving on the branch from aspect ratio 1 towards higher aspect ratio, one can find a configuration where TCF1 is near to zero. In accordance with the present disclosure, using this aspect ratio, not only is TCF1 zeroed, but the remaining (positive) TCF2 and (negative) TCF3 result in a third order frequency-vs-temperature curve having the two turnover temperatures, like that in FIG. 4A.

Example of FIG. 4A is measured from devices which have been created by going through the above described approach. The resonators are piezoelectrically actuated 20-MHz resonators on the SE-WE modal branch, and the resonator dimensions are the following: the composite resonator consists of 20-micrometer-thick layer of phosphorus-doped silicon with dopant concentration above $1.3*10^{20}$ cm$^{-3}$, 1-micrometer-thick layer of aluminium nitride (AlN), and 0.3-micrometer layer of molybdenum as the top electrode. The resonator has a rectangular shape, and its width and length are 188 and 378 micrometers. It should be noted that by scaling the in-plane dimensions of this design, and maintaining the ratios between the thicknesses of the material layers constant, resonators at any frequency can be produced.

The optimal aspect ratio for the above described case of a piezoelectrically actuated resonator has been found to be close to 2 (length to width). Since the optimum aspect ratio depends on the exact doping concentration, thickness of the resonator, and on possibly added other material layers, which add their own contribution to TCF1, the practically usable aspect ratio may deviate from 2 by 10% at maximum, typically by 5% at maximum. The effects of other material layers to TCF2 and TCF3 are smaller. The optimal aspect ratio in each case can be found by experimentally testing resonator designs which have different aspect ratios, varied with small steps, or correspondingly through simulations.

For a similar resonator (from the SE/WE modal branch) which uses electrostatic actuation, as an alternative to piezoelectric actuation, there would not be any added material layers in addition to silicon, and thus the optimal aspect ratio would be less than 2, i.e., somewhere between 1 and 2.

Thus, in the generic case, the aspect ratio of the resonator is different from 1.

Being an experimental result, FIG. 4A also demonstrates the feasibility of the present disclosure for industrial use.

The characteristics of the in-plane flexural (IFP1), out-of-plane flexural (OPF1), or length-extensional/Lame (LE/Lame) modal branches can be utilized in a similar manner as the characteristics of the WE/SE branch, discussed above. Here the parameter to vary is, instead of the aspect ratio of resonator, the alignment of the beam-shaped resonator with respect to [100] crystalline direction.

By moving on the IPF1, IPF2 or LE modal branches with small steps in angular alignment with the [100] direction, one can find a configuration where TCF1 is near to zero. In accordance with the present disclosure, in this configuration, the remaining (positive) TCF2 and (negative) TCF3 result in a third order frequency-vs-temperature curve having the two turnover temperatures, like that in FIG. 4A.

It should be noted that both the in-plane aspect ratio of the resonator and the angular alignment direction can be varied simultaneously to find configurations that result in a third order f-vs-T curve having the two turnover temperatures, like that in FIG. 4A.

The exact deviation of direction of the beam with respect to the [100] crystalline direction depends on the thickness of the resonator, and on possibly added other material layers, which add their own contribution to TCF1. The effects of other material layers to TCF2 and TCF3 are smaller.

Summarizing the aforementioned, in some embodiments, the resonator element comprises a silicon base layer having an n-type dopant concentration of $1.3*10^{20}$ cm$^{-3}$ or above, an aluminum nitride transducer layer, and a conductive electrode layer superimposed on top of each other. The element is shaped as a plate or beam, whose geometry yields, an essentially zero TCF1, a positive TCF2, and a negative TCF3 that bring one turnover point of the frequency-vs-temperature curve of the resonator to the high temperature range.

According to one specific example, the resonator has the characteristics of a resonator disclosed in a still non-published Finnish patent application 20165553.

The exact turnover temperature can be adjusted as desired by design and by fabrication process. In general, by moving on a modal branch, such as on the SE-WE modal branch towards higher aspect ratios, the turnover temperature can be made higher. Similarly, by moving on the in-plane flexural (IFP1), out-of-plane flexural (OPF1), or length-extensional/Lame modal branches towards closer alignment with the [100] direction, the turnover temperature can be made higher. Also, thinner additional material layers having a negative TCF1 result in higher turnover temperature. Such layers can be for example the piezoelectric layers or the top electrode layer. Possibility to adjust the turnover temperature is beneficial as concerns the industrial production of the present oscillator.

Figure 8A:
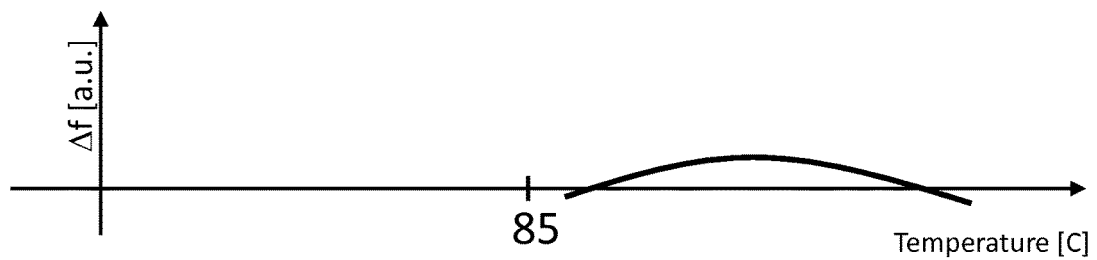
FIGS. 8A-8C show graphs of three different frequency-vs-temperature curves of MEMS resonators, the each of the curves having at least one high-temperature turnover point.
Figure 8B:
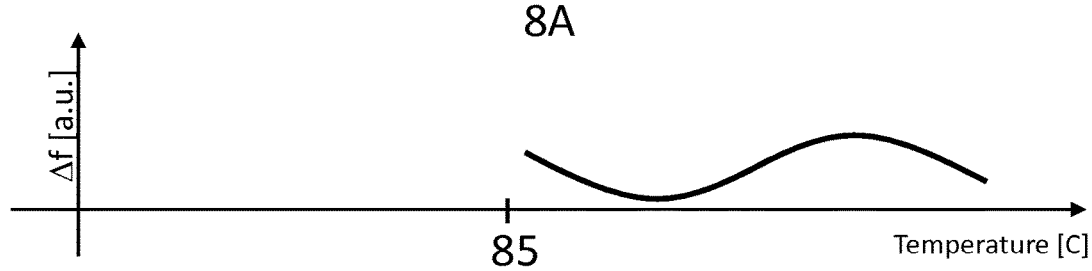
Figure 8C:
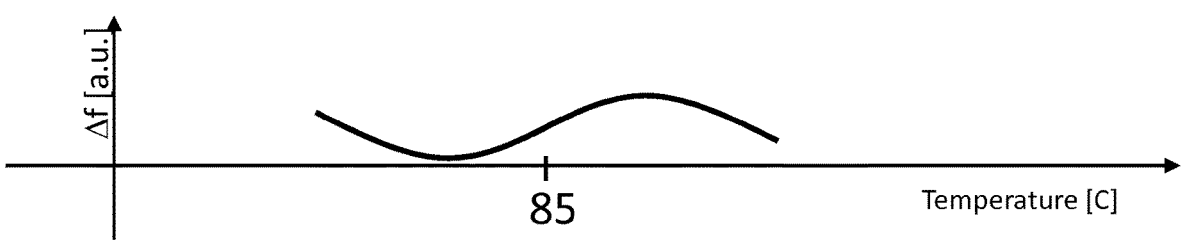

Depending on exact design choices, one can achieve either a single high-temperature turnover point in the frequency-vs-temperature curve, as illustrated in FIG. 8A (doping concentration $c=9'10^{19}$-$1.3*10^{20}$ cm$^{-3}$), a curve with two high-temperature turnover points, as illustrated in FIG. 8B ($c>1.1*10^{20}$ cm$^{-3}$), or a curve with one high- and one low-temperature turnover point, as illustrated in FIG. 8C ($c>1.1*10^{20}$ cm$^{-3}$). The concentration limits for the cases are overlapping, since, for example, added material layers can bring their own contribution to the f-vs-T curve, although most of the characteristics of the f-vs-T curve is dictated by the doped silicon properties. In each case, low curvature of 20 ppb/C$^2$ or less at the high-temperature turnover point can be achieved.

The resonator plate can be a composite structure, for example one comprising a second layer on top of a first layer, the layers having different TCF characteristics. In one embodiment, the linear TCFs of the first layer structure and the second layer structure have opposite signs.

Figure 5:
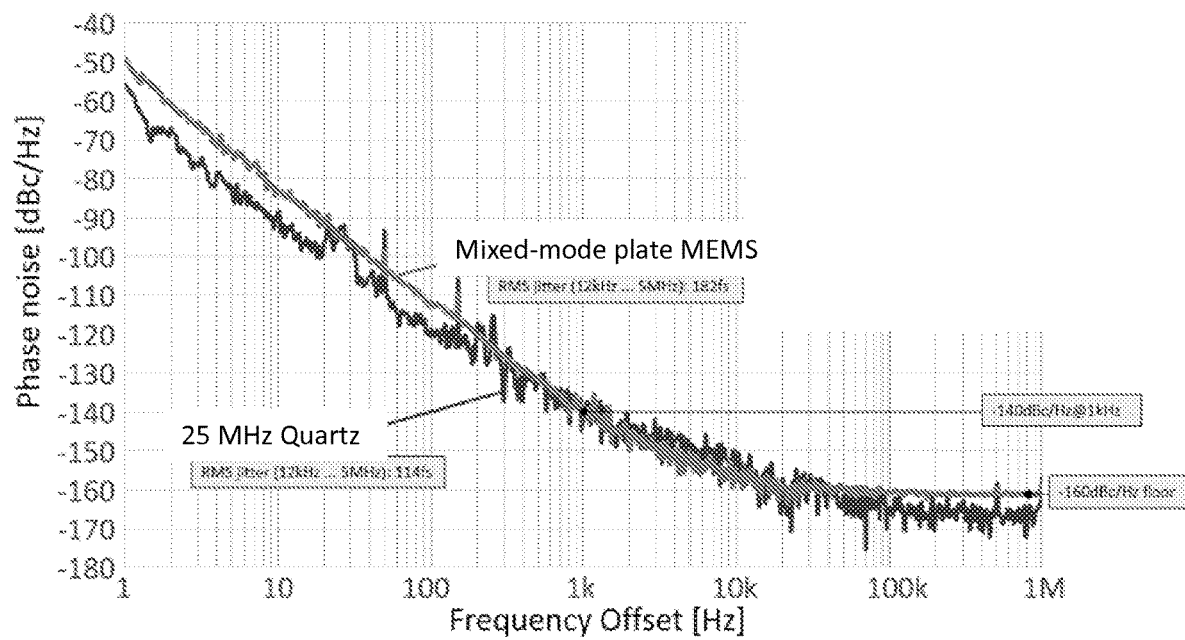
FIG. 5 illustrates measured phase noise of an oscillator based on an AlN coupled MEMS resonator (compared with the same oscillator based on a quartz crystal).

FIG. 5 shows measured phase noise characteristics of an oscillator using a width-extensional mode AlN-actuated rectangular plate resonator, compared with a traditional quartz crystal, demonstrating the potential of the resonator to serve as a very low-noise frequency source.

Thermostatic Control

The thermostatic controller herein preferably includes a heater, such as a resistive heater, placed in the vicinity of the resonator whose temperature is to be stabilized. In addition, there is a temperature sensor, such as a thermistor, for measuring the temperature of each resonator to be temperature-regulated, and a control circuitry capable of using the heater for setting the temperature of the resonator to a predefined value.

The temperature sensor may be a single-point or a multi-point sensor, in which case the temperature value can be averaged from several locations.

Each resonator to be thermostatically controlled is placed in a micro oven, which means a thermally isolated space containing the abovementioned heater and the sensor. In case the two resonators have the same or substantially same turnover temperatures, they may be placed in a single oven, although usually separate ovens are required.

If desired, the driving circuits of the resonators and/or the thermal stability circuit and/or even the thermostatic control circuitry may be placed inside one or more ovens, which may also be the same as the resonator ovens. This can further improve the accuracy and stability of the oscillator.

The first and second resonators may comprise separate thermostatic control units or use a single control unit. Both options are herein covered by the term thermostatic controller.

The invention claimed is:

1. A frequency reference oscillator device comprising
a first oscillator comprising a first resonator having first long-term stability and a first frequency-vs-temperature turnover temperature, the first oscillator being capable of providing a first frequency signal,
a second oscillator comprising a second resonator having second long-term stability, which is inferior to the first long-term stability, and a second frequency-vs-temperature turnover temperature, the second oscillator being capable of providing a second frequency signal,
a thermostatic controller for adjusting the temperature of the first resonator essentially to said first turnover temperature and the temperature of the second resonator essentially to said second turnover temperature, and
a stability control circuit configured to use the first frequency signal for adjusting the frequency of the second oscillator for providing a temperature stabilized and long-term stabilized output frequency signal.

2. The device according to claim 1, wherein the stability control circuit is adapted to use the first frequency signal and a feedback loop utilizing the second frequency signal for adjusting the frequency of the second oscillator, whereby said stabilized output frequency signal and the second frequency signal are obtained at output of the second oscillator.

3. The device according to claim 1, wherein the stability control circuit is functionally independent of the temperature of the first resonator.

4. The device according to claim 1, wherein the thermostatic controller is functionally independent of the first and the second frequency signals.

5. The device according to claim 1, wherein the stability control circuit is configured to operate the first oscillator and to use the first frequency signal intermittently for said adjusting of the second oscillator.

6. The device according to claim 1, wherein the first resonator is a degenerately doped electrostatically actuated single-crystal MEMS resonator.

7. The device according to claim 1, wherein the second resonator is a degenerately doped piezoelectrically actuated composite MEMS resonator, such as an aluminum nitride thin film actuated silicon resonator.

8. The device according to claim 1, wherein the first and/or second oscillator comprises
a resonator comprising silicon doped to an average doping concentration of at least $9*10^{19}$ cm$^{-3}$,
an actuator for exciting the resonator into a resonance mode having a characteristic frequency-vs-temperature curve having a high-temperature turnover point at a turnover temperature of 85° C. or more.

9. The device according to claim 8, wherein said doping concentration of the resonator is at least $1.1*10^{20}$ cm$^{-3}$ and the frequency-vs-temperature curve has two turnover points, one of which is said high-temperature turnover point, the other optionally being a low-temperature turnover point located at a temperature of less than 85° C.

10. The device according to claim 1, wherein both of said first and second turnover temperatures are 85° C. or more.

11. The device according to claim 1, wherein the second turnover temperature is substantially different, in particular at least 5° C. different, from the first turnover temperature.

12. The device according to claim 1, wherein the second turnover temperature is substantially equal to the first turnover temperature, in particular differing at most 5° C. therefrom, and the thermostatic controller is adapted to adjust the temperatures of the first and second resonator essentially to the same temperature.

13. The device according to claim 1, wherein the second oscillator has lower characteristic phase noise than the first oscillator when the frequency offsets from the respective carrier frequencies are above a certain frequency, such as 100 Hz, offset from the respective carrier.

14. The device according to claim 1, wherein the first resonator is a plate resonator adapted to oscillate in Lame mode or a beam resonator adapted to oscillate in length extensional mode.

15. The device according to claim 1, wherein the first and/or second resonator is a plate element with an in-plane aspect ratio different from 1 or a beam element, and is adapted to oscillate in the square extensional/width extensional, in-plane flexural, out-of-plane flexural, or length-extensional/Lame modal branch.

16. The device according to claim 1, wherein the first and/or second resonator is a silicon-based resonator doped to an average concentration of $1.1*10^{20}$ cm$^{-3}$ or more, such as $1.3*10^{20}$ cm$^{-3}$ or more.

17. The oscillator device according to claim 1, wherein the second resonator comprises
a silicon base layer having an n-type dopant concentration of $1.3*10^{20}$ cm$^{-3}$ or above,
an aluminum nitride transducer layer and a conductive electrode layer superimposed on top of the base layer, and wherein the resonator is shaped as a plate or beam, whose geometry yields for the element in said resonance mode an essentially zero TCF1 along with TCF2 and TCF3 characteristics that provide said at least two turnover points.

18. The device according to claim 1, wherein the stability control circuit comprises a phase locked loop (PLL)-based circuit, such as a fractional-N PLL circuit or a microcontroller-based circuit.

19. The device according to claim 1, wherein the first and second resonators are degenerately doped silicon resonators adapted to resonate in different resonance modes.

20. A method of stabilizing a frequency reference signal, the method comprising
providing a first oscillator comprising a first resonator having first long-term stability and a first frequency-vs-temperature turnover temperature, the first oscillator being capable of providing a first frequency signal, providing a second oscillator comprising a second resonator having second long-term stability, which is inferior to the first long-term stability, and a second frequency-vs-temperature turnover temperature, the second oscillator being capable of providing a second frequency signal, using thermostatic control for heating the first resonator to said first turnover temperature and the second resonator to said second turnover temperature, using the first frequency signal to adjust the second oscillator for providing a stabilized output frequency signal.

21. The method according to claim 20, wherein a frequency reference oscillator device is used.

* * * * *